United States Patent
Kim et al.

(10) Patent No.: US 7,439,770 B2
(45) Date of Patent: Oct. 21, 2008

(54) MAGNETIC TUNNELING JUNCTION BASED LOGIC CIRCUITS AND METHODS OF OPERATING THE SAME

(75) Inventors: Tae-wan Kim, Yongin-si (KR); Kee-won Kim, Yongin-si (KR); Hyung-soon Shin, Seoul (KR); Seung-jun Lee, Seoul (KR); In-jun Hwang, Yongin-si (KR); Young-jin Cho, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 11/654,002

(22) Filed: Jan. 17, 2007

(65) Prior Publication Data
US 2008/0013369 A1    Jan. 17, 2008

(30) Foreign Application Priority Data
Feb. 22, 2006    (KR) ..................... 10-2006-0017060

(51) Int. Cl.
*H03K 19/21* (2006.01)
(52) U.S. Cl. .................. 326/52; 326/134; 326/136; 365/158; 365/171
(58) Field of Classification Search ................. 326/52, 326/104, 134, 136; 365/158, 171; 438/3; 257/421
See application file for complete search history.

(56) References Cited

U.S. PATENT DOCUMENTS

| 6,034,887 | A | 3/2000 | Gupta et al. |
| 6,391,483 | B1* | 5/2002 | Zhu et al. ..................... 428/810 |
| 6,498,747 | B1* | 12/2002 | Gogl et al. .................... 365/158 |
| 6,653,704 | B1* | 11/2003 | Gurney et al. ................ 257/421 |
| 6,783,994 | B2* | 8/2004 | Rizzo et al. ..................... 438/3 |
| 7,027,319 | B2* | 4/2006 | Anthony et al. ............. 365/158 |
| 2005/0073882 | A1 | 4/2005 | Smith et al. |
| 2005/0269612 | A1 | 12/2005 | Torok et al. |

FOREIGN PATENT DOCUMENTS

WO    WO 00/58970 A    10/2000

OTHER PUBLICATIONS

European Patent Office Search Report dated Jun. 6, 2007, for corresponding European Patent Application No. 06118793.6-2210.

* cited by examiner

*Primary Examiner*—Vibol Tan
(74) *Attorney, Agent, or Firm*—Harness Dickey & Pierce, P.L.C.

(57) ABSTRACT

MTJ cell based logic circuits and MTJ cell drivers having improved operating speeds compared to the conventional art, and operating methods thereof are described. An MTJ cell driver may include a lower electrode, an MTJ cell on the lower electrode, an upper electrode on the MTJ cell, and first through third input lines arranged in parallel above the upper electrode

25 Claims, 19 Drawing Sheets

SET:
1. INPUT C: I
   INPUT A: −I(0)
   INPUT B: −I(0)
2. INPUT C: 0
   INPUT A: +I(1)
   INPUT B: +I(1)

LOGIC:
INPUT C: I
INPUT A: −I(0)
INPUT B: −I(0)

R = LOW (0)

FIG. 4

| A | B | C | R | OUT |
|---|---|---|---|---|
| 0 | 0 |   | $R_L$ | 0 |
| 0 | 1 | I | $R_H$ | 1 |
| 1 | 0 |   | $R_H$ | 1 |
| 1 | 1 |   | $R_L$ | 0 |

SET:
INPUT S: +I(1)
INPUT A: +I(1)
INPUT B: +I(1)

LOGIC:
INPUT S: −I(0)
INPUT A: −I(0)
INPUT B: −I(0)

R = LOW (0)

Input S: $-\mathbf{I}(0)$
Input A: $-\mathbf{I}(0)$
Input B: $+\mathbf{I}(1)$

R = HIGH (1)

INPUT S: $-\mathbf{I}(0)$
INPUT A: $+\mathbf{I}(1)$
INPUT B: $-\mathbf{I}(0)$

R = HIGH (1)

INPUT S: $-\mathbf{I}(0)$
INPUT A: $+\mathbf{I}(1)$
INPUT B: $+\mathbf{I}(1)$

R = LOW (0)

MAGNETIC TUNNELING JUNCTION BASED LOGIC CIRCUITS AND METHODS OF OPERATING THE SAME

PRIORITY STATEMENT

This application claims priority under 35 U.S.C. §119 to Korean Patent Application No. 10-2006-0017060, filed on Feb. 22, 2006, in the Korean Intellectual Property Office (KIPO), the entire disclosure of which is incorporated herein by reference.

BACKGROUND

Example embodiments relate to magnetic tunneling junction (MTJ) cell based logic circuits and methods of operating the same. For example, example embodiments may relate to MTJ cell based XOR logic circuits which may have an improved operating speed, and methods of operating the same.

DESCRIPTION OF THE CONVENTIONAL ART

A magnetic tunneling junction (MTJ) cell may be constructed of two ferromagnetic layers and an insulation film having a thickness of a few nanometers (e.g., a tunnel barrier) disposed between the two ferromagnetic layers. The resistance of the MTJ cell may vary according to the direction of magnetization of the two ferromagnetic layers. For example, if the magnetization directions of the two ferromagnetic layers are the same, a reduction in the resistance of the tunnel barrier may be obtained, thereby decreasing the resistance of the MTJ cell. If the magnetization directions of the two ferromagnetic layers are opposite, an increased resistance of the MTJ cell may be obtained. Research into manufacturing memory components (e.g., magnetic random access memories (MRAM)) for recording data using characteristics of MTJ cells has been performed. A method of manufacturing an XOR logic circuit using an MTJ cell has recently been developed. Thus, not only memory components but also non-memory semiconductor chips for performing a function may be manufactured using MTJ cells.

FIG. 1 is a schematic perspective view of a conventional MTJ cell driver 11 for realizing a conventional XOR logic circuit. Referring to FIG. 1, the MTJ cell driver 11 may include an MTJ cell 13, an upper electrode 14, and a lower electrode 12, which may be disposed on the top and bottom of the MTJ cell 13, respectively. The MTJ cell driver 11 may further include two parallel input lines 15A and 15B, which may cross above the upper electrode 14. The MTJ cell 13 may include a fixed ferromagnetic layer 13b, a tunnel barrier layer 13c, and a free ferromagnetic layer 13d layered from bottom to top, respectively, above an anti-ferromagnetic layer 13a.

Referring to FIG. 1, if currents flow in the same direction through the two input lines 15A and 15B, the magnetization direction of the free ferromagnetic layer 13d may be changed due to magnetic fields generated around the two input lines 15A and 15B. In contrast, if currents flow in opposite directions through the two input lines 15A and 15B, the magnetic fields generated around the two input lines 15A and 15B cancel each other out, thereby not changing the magnetization direction of the free ferromagnetic layer 13d. If no current flows through the upper and lower electrodes 14 and 12, the magnetization direction of the fixed ferromagnetic layer 13b, which is coupled with the anti-ferromagnetic layer 13a, may not be changed. However, if current flows through the upper and lower electrodes 14 and 12, heat may be generated, weakening the coupling between the anti-ferromagnetic layer 13a and the fixed ferromagnetic layer 13b. In this example, if currents having the same direction flow through the two input lines 15A and 15B, the magnetization direction of the fixed ferromagnetic layer 13b may be changed.

Thus, by controlling each of the currents applied to the two input lines 15A and 15B and the upper and lower electrodes 14 and 12, various operational states of the MTJ cell 13 can be obtained as illustrated in FIGS. 2A through 2E. In FIGS. 2A through 2E, INPUT A denotes a current applied to the input line 15A, INPUT B denotes a current applied to the input line 15B, and INPUT C denotes a current applied to the upper and lower electrodes 14 and 12. A positive current +I, which may flow in the positive X-direction, flowing through the input lines 15A or 15B, may be defined to be logic "1". A negative current −I, which may flow in the negative X-direction, flowing through the input lines 15A or 15B, may be defined to be logic "0".

For the operation of a conventional MTJ cell based XOR logic circuit, two procedures for initializing the MTJ cell 13 are illustrated in FIG. 2A. That is, while a current is applied to the upper and lower electrodes 14 and 12, a current −I is applied to both of the two input lines 15A and 15B. Then, the fixed ferromagnetic layer 13b and the free ferromagnetic layer 13d are magnetized in the left direction of FIG. 2A. Thereafter, a current +I is applied to both of the two input lines 15A and 15B while applying no current to the upper and lower electrodes 14 and 12. Then, only the free ferromagnetic layer 13d is magnetized in the right direction of FIG. 2A. As a result, in the MTJ cell 13 after the initialization, the fixed ferromagnetic layer 13b is magnetized in the left direction of FIG. 2A, and the free ferromagnetic layer 13d is magnetized in the right direction of FIG. 2A. Hereinafter all left and right directions are taken with reference to the drawing being referred to.

After the initialization, as illustrated in FIGS. 2B through 2E, if currents are applied to the two input lines 15A and 15B while a current is applied to the upper and lower electrodes 14 and 12, the resistance of the MTJ cell 13 is determined as high (logic "1") or low (logic "0") according to the directions of the currents applied to the two input lines 15A and 15B. For example, as illustrated in FIGS. 2C and 2D, if the directions of the currents applied to the two input lines 15A and 15B are different from each other, the MTJ cell 13 maintains the initialization state, having a high resistance $R_H$. As illustrated in FIGS. 2B and 2E, if the directions of the currents applied to the two input lines 15A and 15B are the same, the magnetization directions of the fixed ferromagnetic layer 13b and the free ferromagnetic layer 13d are the same, and thus the MTJ cell 13 has a low resistance $R_L$.

Since the resistance of the MTJ cell 13 may vary according to the relative directions of the currents applied to the two input lines 15A and 15B, an XOR logic circuit may be realized by comparing the resistance of the MTJ cell 13 to the resistance of a reference resistor, and outputting logic "0" or "1" according to the comparison result.

FIG. 3 is a circuit diagram of an XOR logic circuit 10 generating an output by comparing the resistance of the MTJ cell 13 of FIG. 1 to the resistance of a reference resistor 16. Referring to FIG. 3, the XOR logic circuit 10 includes the MTJ cell driver 11 illustrated in FIG. 1, the reference resistor 16, and an amplifier 18 for comparing the resistance of the MTJ cell 13 to the resistance of the reference resistor 16. One end of each of the reference resistor 16 and the MTJ cell 13 is grounded, and the other ends are respectively connected to two input terminals of the amplifier 18. The resistance of the reference resistor 16 may be the same as the low resistance $R_L$ of the MTJ cell 13. If the resistance of the MTJ cell 13 is higher than the resistance of the reference resistor 16, the output of the amplifier 18 may be logic "1". If the resistance of the MTJ cell 13 is the same as the resistance of the reference resistor 16, the output of the amplifier 18 may be logic "0". To facilitate this, an offset voltage $V_{OS}$ of the amplifier 18 satisfies the relation $-I_{sens} \cdot \Delta R < V_{OS} < 0$ ($\Delta R = R_H - R_L$). The output values of the XOR logic circuit 10 according to the currents applied to the two input lines 15A and 15B are illustrated in FIG. 4.

However, in the conventional XOR logic circuit 10 described above, it may be necessary to initialize the MTJ cell 13 every time a certain logic operation is performed. That is, since the magnetization directions of the fixed ferromagnetic layer 13b and the free ferromagnetic layer 13d are changed after a certain logic operation, the magnetization directions of the fixed ferromagnetic layer 13b and the free ferromagnetic layer 13d must be initialized through the two procedures illustrated in FIG. 2A. Thus, the conventional XOR logic circuit 10 may have a slow operation speed. In addition, according to the conventional art, to change the magnetization direction of the fixed ferromagnetic layer 13b, heat is generated by applying a current to the MTJ cell 13. Accordingly, the coupling between the anti-ferromagnetic layer 13a and the fixed ferromagnetic layer 13b is relatively easily degraded, thereby shortening the life span of the MTJ cell 13.

SUMMARY

Example embodiments may provide a high-speed Exclusive-OR (XOR) logic circuit using a magnetic tunneling junction (MTJ) cell in which an initialization process may include one procedure (or even no initialization procedure at all), and an operating method thereof.

Example embodiments may also provide an XOR logic circuit using an MTJ cell having a longer life span than a conventional MTJ cell.

In Example embodiments a magnetic tunneling junction (MTJ) cell driver may include a lower electrode, an MTJ cell on the lower electrode, an upper electrode on the MTJ cell, and first through third input lines arranged in parallel on the upper electrode.

In an example embodiment, the MTJ cell may include a lower ferromagnetic layer, a tunnel barrier layer on the lower ferromagnetic layer, and an upper ferromagnetic layer on the tunnel barrier layer.

In an example embodiment, if the directions of currents applied to the first through third input lines are all the same, magnetization directions of the upper and lower ferromagnetic layers are changed according to the direction of the currents.

In an example embodiment, if the directions of two currents applied to the first, second, and third input lines are the same, only the magnetization direction of the upper ferromagnetic layer is changed according to the direction of the at least two currents.

In an example embodiment, the MTJ cell may be initialized by applying a current having the same direction to all of the first, second, and third input lines.

According to example embodiments, an Exclusive-OR (XOR) logic circuit may include the MTJ cell driver of claim 1, a reference resistor, and a comparison unit outputting logic "0" or "1" by comparing a resistance of the MTJ cell to the resistance of the reference resistor. In an example embodiment the MTJ cell driver may switch the resistance of the MTJ cell between a first resistance and a second resistance.

In an example embodiment, during a logic operation, the direction of a current applied to the first input line may be maintained opposite to the direction of an initialization current, and the directions of currents applied to the second and third input lines may be determined by input logic values.

In an example embodiment, the resistance of the reference resistor may be the same as the first resistance of the MTJ cell.

In an example embodiment, the comparison unit may output logic "0" if the resistance of the MTJ cell is the same as the resistance of the reference resistor and may output logic "1" if the resistance of the MTJ cell is higher than the resistance of the reference resistor.

In an example embodiment, the resistance of the reference resistor may be in a range between the first and second resistances of the MTJ cell.

In an example embodiment, the comparison unit may output logic "0" if the resistance of the MTJ cell is lower than the resistance of the reference resistor and may output logic "1" if the resistance of the MTJ cell is higher than the resistance of the reference resistor.

In an example embodiment the first input line may be on the upper electrode, the second input line may be on the first input line, and the third input line may be on the second input line.

According to example embodiments, the MTJ cell may include an anti-ferromagnetic layer, a fixed ferromagnetic layer on the anti-ferromagnetic layer, having a fixed magnetization direction, a tunnel barrier layer on the fixed ferromagnetic layer, and a free ferromagnetic layer on the tunnel barrier layer.

In an example embodiment, if the directions of at least two currents applied to the first, second, and third input lines are the same, the magnetization direction of the free ferromagnetic layer is changed according to the direction of the at least two currents.

According to example embodiments, an Exclusive-OR (XOR) logic circuit may include a first and a second MTJ cell driver, a comparison unit which may output logic "0" or "1" by comparing a resistance of the first MTJ cell to a resistance of the second MTJ cell. In an example embodiment, the first and second MTJ cell drivers may switch the resistance of the first MTJ cell and the second MTJ cell, between a first resistance and a second resistance.

In an example embodiment, during a logic operation, the direction of a current applied to the first input line of the first MTJ cell driver is opposite to the direction of a current applied to the first input line of the second MTJ cell driver, and the directions of currents applied to the second and third input lines of the first and second MTJ cell drivers are determined by input logic values.

In an example embodiment logic "1" may be defined as a state where the resistance of each of the first and second MTJ cells is relatively high, and logic "0" is defined as a state where the resistance of each of the first and second MTJ cells is relatively low. In example embodiments, the first MTJ cell driver may operate as a NAND logic circuit, and the second MTJ cell driver may operate as a NOR logic circuit.

In an example embodiment, the comparison unit may output logic "0" if the resistance of the first MTJ cell is the same as the resistance of the second MTJ cell and may output logic "1" if the resistance of the first MTJ cell is higher than the resistance of the second MTJ cell.

According to example embodiments, methods of operating an Exclusive-OR (XOR) logic circuits may include maintaining a direction of a current applied to a first input line of a first MTJ cell driver including a MTJ cell, applying currents to second and third input lines of the MTJ cell driver arranged in parallel and cross above the MTJ cell determined by input logic values, and outputting logic "0" or "1" by comparing the resistance of the MTJ cell to a reference resistance.

In an example embodiment, the method may also include initializing the MTJ cell in order to magnetize upper and lower ferromagnetic layers in the same direction by applying currents to the first through third input lines.

In an example embodiment, the current maintained on the first input line may be opposite to the direction of the current applied during the initialization.

In an example embodiment, if the directions of currents applied to the first through third input lines are all the same, magnetization directions of the upper and lower ferromagnetic layers are changed according to the directions of the currents.

In an example embodiment, if the directions of two currents applied to the first through third input lines are the same, only the magnetization direction of the upper ferromagnetic layer is changed according to the directions of the currents.

In an example embodiment, logic "0" may be output if the resistance of the MTJ cell is the same as the reference resistance, and logic "1" may be output if the resistance of the MTJ cell is higher than the reference resistance.

In an example embodiment, the reference resistance may be a MTJ cell of a second MTJ driver.

In an example embodiment, the direction of a current applied to the first input line of the first MTJ cell driver may be opposite to the direction of a current applied to the first input line of the second MTJ cell driver, and the directions of currents applied to the second and third input lines of the first and second MTJ cell drivers may be determined by input logic values.

In an example embodiment, logic "1" may be defined as a state where the resistance of each of the MTJ cells is relatively high, and logic "0" may be defined as a state where the resistance of each of the MTJ cells is relatively low.

In an example embodiment, the MTJ cell driver may operate as a NAND logic circuit, and the second MTJ cell driver may operate as a NOR logic circuit.

According to another example embodiment of the present invention, an MTJ cell driver may comprise an MTJ cell, an upper electrode and a lower electrode disposed on the top and the bottom of the MTJ cell, respectively, and first through third input lines arranged in parallel and crossing above the upper electrode. The MTJ cell driver may further include a reference resistor, and a comparison unit outputting logic "0" or "1" by comparing the resistance of the MTJ cell to the resistance of the reference resistor. The MTJ cell driver may switch the resistance of the MTJ cell between a first resistance and a second resistance.

In an example embodiment, the MTJ cell may include a lower ferromagnetic layer, a tunnel barrier layer disposed on the lower ferromagnetic layer, and an upper ferromagnetic layer disposed on the tunnel barrier layer.

In an example embodiment, if the directions of currents applied to the first through third input lines are all the same, magnetization directions of the upper and lower ferromagnetic layers may be changed according to the directions of the currents. In another example embodiment, if the directions of two of the currents applied to the first, second, and third input lines are the same, the magnetization direction of the upper ferromagnetic layer may be changed according to the directions of the currents.

In an example embodiment, before a logic operation is performed, the MTJ cell may be initialized by applying a current having the same direction to the first, second, and third input lines so that the upper and lower ferromagnetic layers are magnetized in the same direction.

In an example embodiment, during the logic operation, the direction of the current applied to the first input line may be maintained opposite to the direction of the initialization, and the directions of the currents applied to the second and third input lines may be determined by input logic values.

In an example embodiment, the resistance of the reference resistor may be the same as the first resistance of the MTJ cell. In example embodiments, the comparison unit may output logic "0" if the resistance of the MTJ cell is the same as the resistance of the reference resistor and output logic "1" if the resistance of the MTJ cell is higher than the resistance of the reference resistor.

In an example embodiment, the resistance of the reference resistor may be in a range between the first and second resistances of the MTJ cell. In this example, the comparison unit may output logic "0" if the resistance of the MTJ cell is lower than the resistance of the reference resistor and output logic "1" if the resistance of the MTJ cell is higher than the resistance of the reference resistor.

In an example embodiment, the first, second, and third input lines may be arranged vertically.

According to another example embodiment of the present invention, an Exclusive-OR (XOR) logic circuit may include first and second magnetic tunneling junction (MTJ) cell drivers. The MTJ cell drivers may include an MTJ cell, an upper electrode, e first through third input lines and a comparison unit outputting logic "0" or "1". The upper and lower electrodes may be disposed on the top and bottom of the corresponding MTJ cell. The first through third input lines may be arranged in parallel, crossing above the upper electrode. The comparison unit may compare the resistance of the first MTJ cell and the second MTJ cell. The first and second MTJ cell drivers may change the resistance of the first and second MTJ cells (e.g., between a first and second resistance), respectively.

In an example embodiment, each of the first and second MTJ cells may include an anti-ferromagnetic layer, a fixed ferromagnetic layer disposed on the anti-ferromagnetic layer and having a fixed magnetization direction, a tunnel barrier layer disposed on the fixed ferromagnetic layer; and a free ferromagnetic layer disposed on the tunnel barrier layer and having a variable magnetization direction.

In an example embodiment, the magnetization direction of the free ferromagnetic layer may be determined according to the direction of two or more currents applied in the same direction among currents applied to the first through third input lines.

In an example embodiment, during a logic operation, the direction of a current applied to the first input line of the first MTJ cell driver may be opposite to the direction of a current applied to the first input line of the second MTJ cell driver, and the directions of currents applied to the second and third input lines of the first and second MTJ cell drivers may be determined by input logic values.

In an example embodiment, logic "1" may be defined as a relatively high resistance of each of the first and second MTJ cells logic "0" may be defined as a relatively low resistance of each of the first and second MTJ cells. The first MTJ cell may operate as a NAND logic circuit and the second MTJ cell may operate as a NOR logic circuit.

In another example embodiment, the first MTJ cell may operate as an OR logic circuit and the second MTJ cell may operate as an AND logic circuit.

In an example embodiment, the comparison unit may output logic "0" if the resistance of the first MTJ cell is the same as the resistance of the second MTJ cell. The comparison unit may also output logic "1" if the resistance of the first MTJ cell is higher than the resistance of the second MTJ cell.

According to another example embodiment, a method of operating an Exclusive-OR (XOR) logic circuit may use a magnetic tunneling junction (MTJ) cell having a lower ferromagnetic layer, a tunnel barrier layer, and an upper ferromagnetic layer. The layers may be stacked sequentially. The method of operating an XOR logic circuit may include initializing the MTJ cell, maintaining a direction of a current applied to the first input line opposite to a direction of a current applied during initialization, applying currents to the second and third input lines input logic, and outputting logic "0" or "1" by comparing the resistance of the MTJ cell to the resistance of a reference resistor. The initializing step may be in order to magnetize the upper and lower ferromagnetic layers in the same direction. The initialization step may include applying currents to the first through third input lines. The first through third input lines may be arranged in parallel and may cross above the MTJ cell. The currents applied to the second and third input lines after initialization may be determined by input logic values.

BRIEF DESCRIPTION OF THE DRAWINGS

Example embodiments may become more apparent by describing them in detail with reference to the attached drawings in which:

Figure 4:
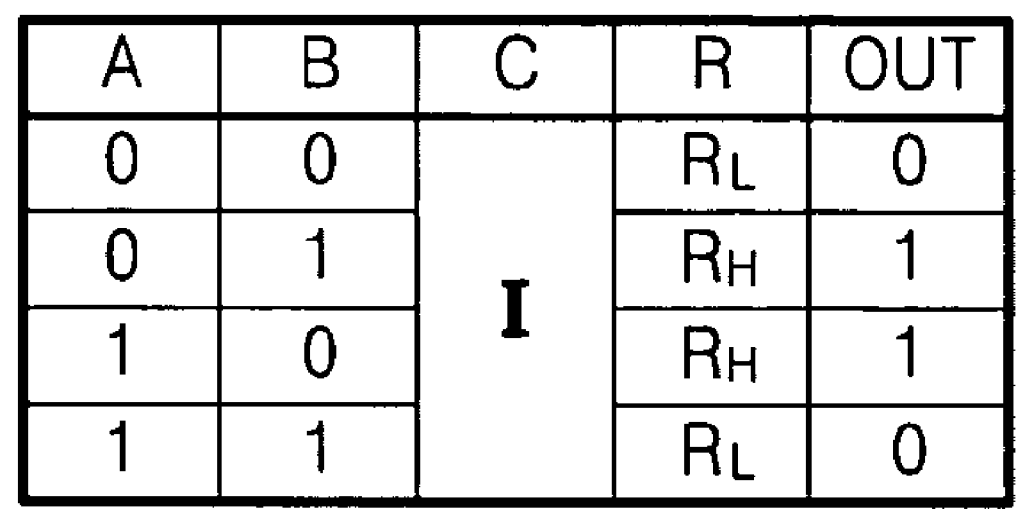

FIG. 4 is a table illustrating output values obtained according to input values of the XOR logic circuit of FIG. 3;

DETAILED DESCRIPTION OF EXAMPLE EMBODIMENTS

Figure 1:
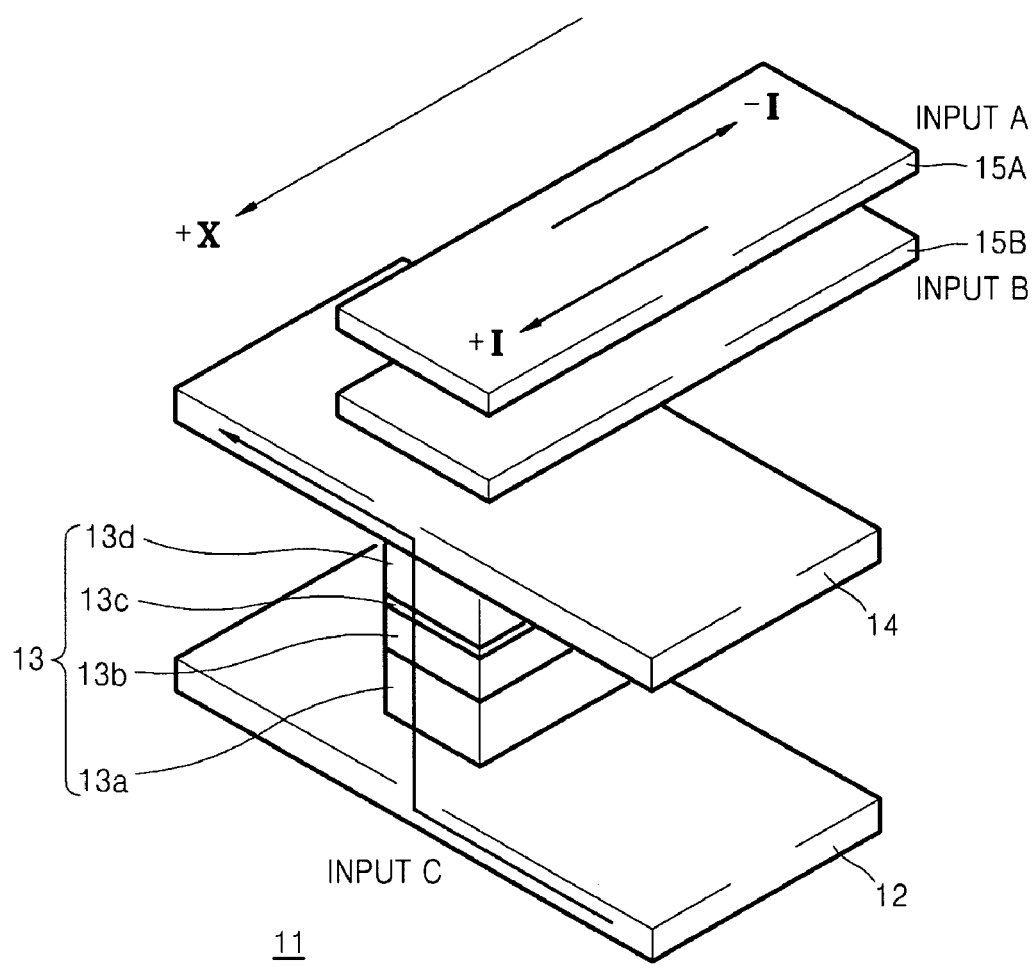
FIG. 1 is a schematic perspective view of a conventional MTJ cell driver for realizing an XOR logic circuit.
Figure 2A:
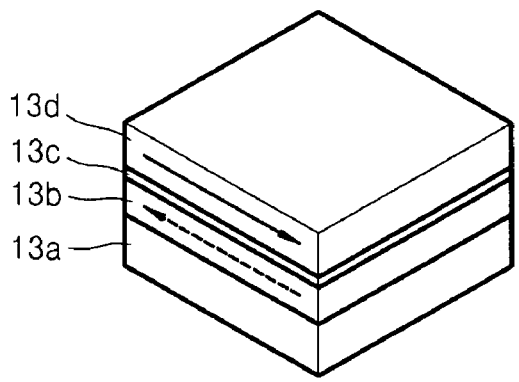
FIGS. 2A through 2E illustrate operational states of the conventional MTJ cell of FIG. 1.
Figure 2B:
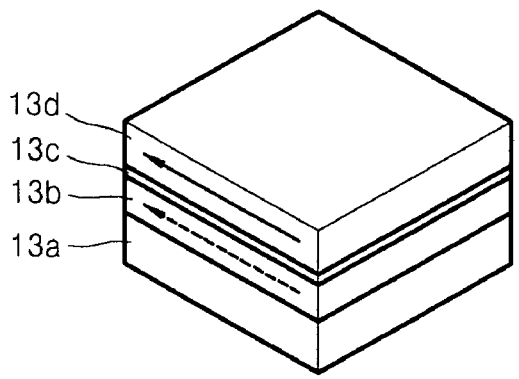
Figure 2C:
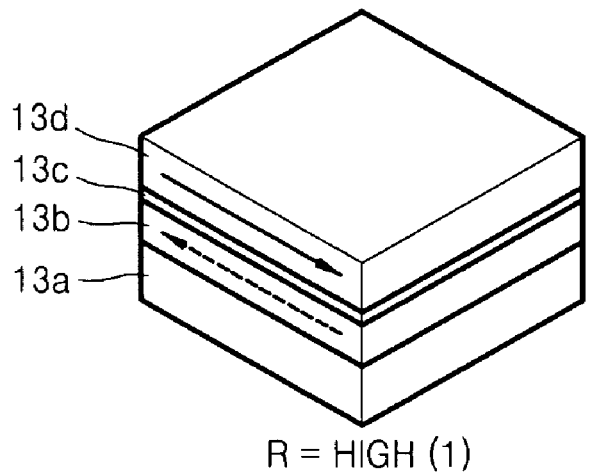
Figure 2D:
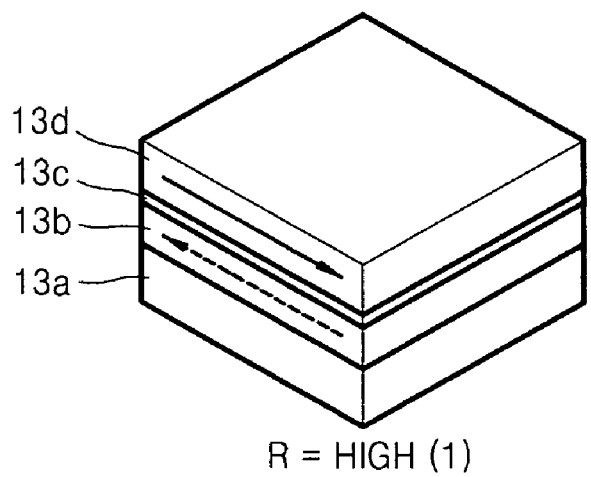
Figure 2E:
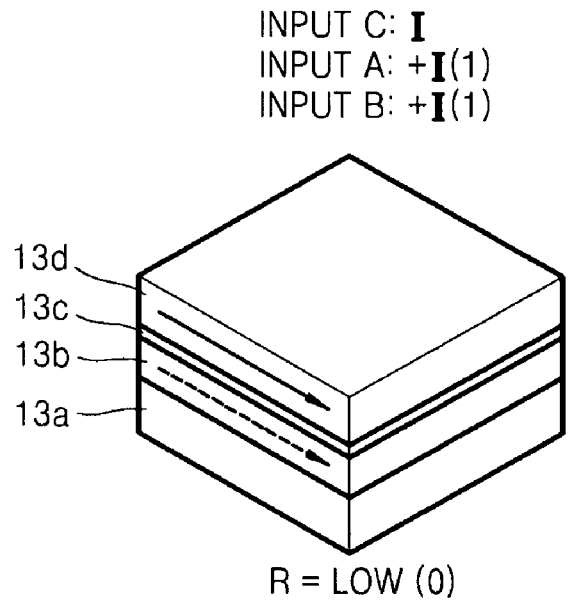
Figure 3:
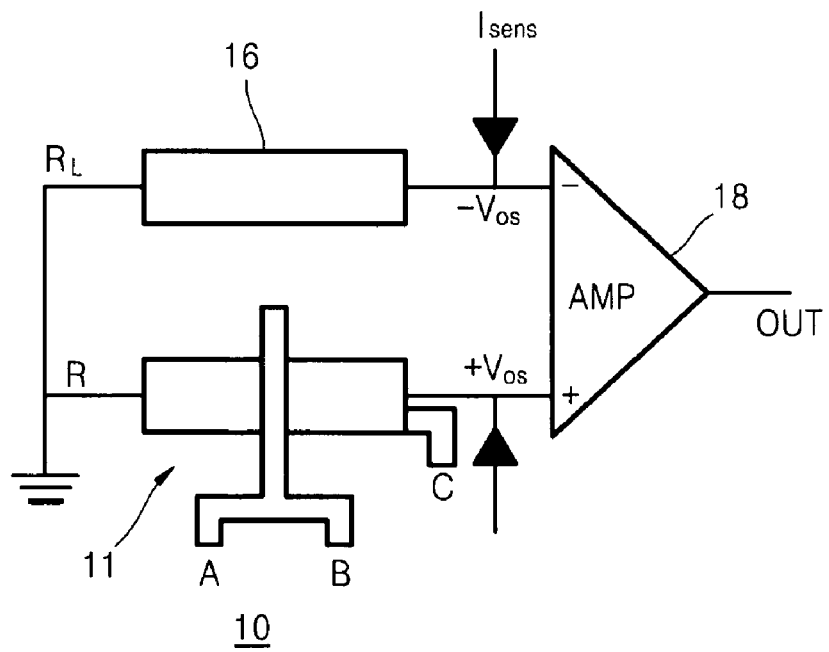
FIG. 3 is a circuit diagram of an XOR logic circuit using the conventional MTJ cell driver of FIG. 1.

Detailed illustrative embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments will now be described more fully with reference to the accompanying drawings.

Figure 5:
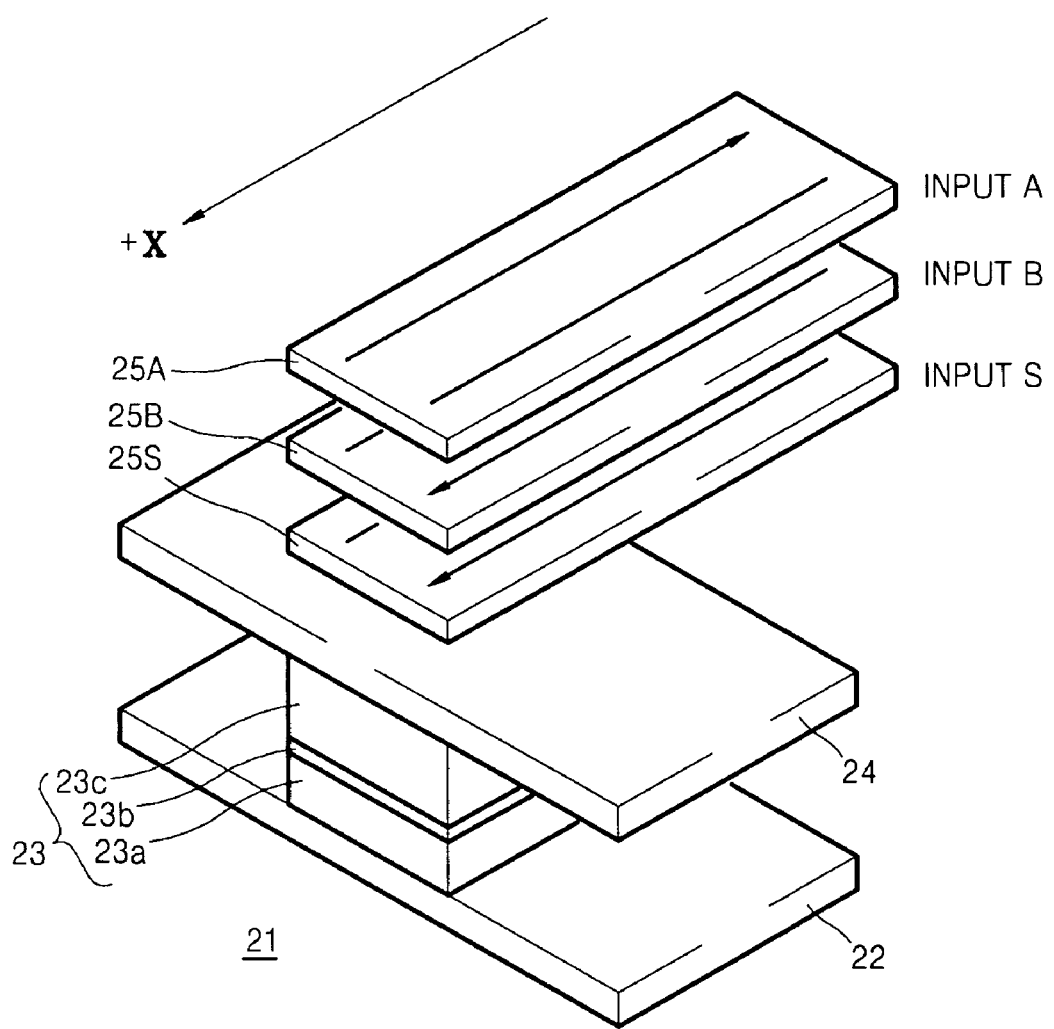
FIG. 5 is a schematic perspective view of an MTJ cell driver for realizing an XOR logic circuit, according to an example embodiment.

FIG. 5 is a schematic perspective view of an MTJ cell driver 21 for realizing an XOR logic circuit, according to an example embodiment. Referring to FIG. 5, the MTJ cell driver 21 may include an MTJ cell 23, an upper electrode 24 and a lower electrode 22, which are disposed on the top and bottom of the MTJ cell 23, respectively, and three parallel input lines 25A, 25B, and 25S, which cross above the upper electrode 24. The MTJ cell 23 may include a lower ferromagnetic layer 23a, a tunnel barrier layer 23b disposed on the lower ferromagnetic layer 23a, and an upper ferromagnetic layer 23c disposed on the tunnel barrier layer 23b. As illustrated in FIG. 5, the three parallel input lines 25A, 25B, and 25S may be arranged vertically (e.g., 25A on 25B on 25S) or in a stacked arrangement.

In the example of the MTJ cell 23 according to example embodiments, because an anti-ferromagnetic layer performing ferromagnetic exchange coupling with the lower ferromagnetic layer 23a is not disposed below the lower ferromagnetic layer 23a, a magnetization direction of the lower ferromagnetic layer 23a can be changed according to the directions of currents applied to the three input lines 25A, 25B, and 25S. For example, if the directions of the currents applied to the three input lines 25A, 25B, and 25S are all the same, magnetization directions of the upper and lower ferromagnetic layers 23c and 23a may be changed according to the directions of the currents. If the directions of two of the currents applied to the three input lines 25A, 25B, and 25S are the same, only the magnetization direction of the upper ferromagnetic layer 23c may be changed since a magnetic field generated around the three input lines 25A, 25B, and 25S may be relatively weak.

For example, referring to FIG. 5, when a positive current +I, which flows in the +X direction, is applied to all three of the input lines 25A, 25B, and 25S, the upper and lower ferromagnetic layers 23c and 23a may be magnetized in the right direction. If the positive current +I is applied to any two of the three input lines 25A, 25B, and 25S, and a negative current −I, which flows in the −X direction, is applied to the other input line, only the upper ferromagnetic layer 23c may be magnetized in the right direction.

The contrary may be similar. For example, if the negative current −I is applied to all three of the input lines 25A, 25B, and 25S, the upper and lower ferromagnetic layers 23c and 23a may be magnetized in the left direction. If the negative current −I is applied to any two of the three input lines 25A, 25B, and 25S and the positive current +I is applied to the other input line, only the upper ferromagnetic layer 23c may be magnetized in the left direction.

Thus, various operational states of the MTJ cell 23, (examples are illustrated in FIG. 6A through 6E) may be obtained by controlling the currents and/or current directions applied to the three input lines 25A, 25B, and 25S. Referring to FIG. 6A through 6E, INPUT A denotes a current applied to the input line 25A, INPUT B denotes a current applied to the input line 25B, and INPUT S denotes a current applied to the input line 25S. A state where a positive current +I flows through one of the three input lines 25A, 25B, and 25S may be defined as logic "1" for that input line, and a state where a negative current −I flows through one of the three input lines 25A, 25B, and 25S may be defined as logic "0" for that input line.

Figure 6A:
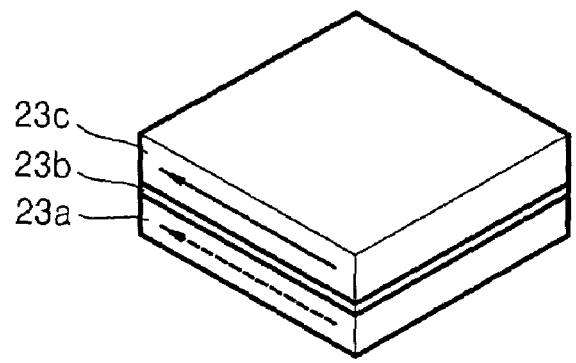
FIGS. 6A through 6E illustrate operational states of the MTJ cell of FIG. 5, according to an example embodiment.

Initialization of the MTJ cell 23 may be illustrated in FIG. 6A. That is, the upper and lower ferromagnetic layers 23c and 23a are magnetized in the left direction by applying a negative current −I to each of the three input lines 25A, 25B, and 25S. Thus, the initialization is performed through only one procedure according to example embodiments, unlike the conventional art, which requires two initialization procedures. However, the initialization of the MTJ cell 23 may also be set in the right direction by simply applying a positive current +I to each of the three input lines 25A, 25B, and 25S.

Figure 6B:
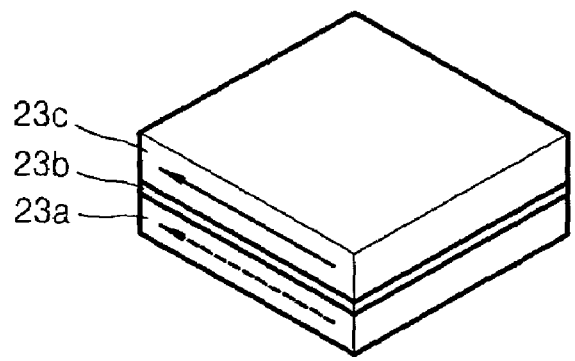

After the initialization of the MTJ cell 23, XOR logic operations illustrated in FIGS. 6B through 6E may be performed. In the XOR logic operations, the direction of the current applied to the input line 25S may be maintained or applied during the operations as +I, opposite to that of the initialization procedure, and the directions of the currents applied to the input line 25A and the input line 25B may be determined by any logic values input. For example, as illustrated in FIG. 6B, if a positive current +I is applied to the input line 25S and a negative current −I is applied to both the input line 25A and the input line 25B, the upper and lower ferromagnetic layers 23c and 23a of the MTJ cell 23 may maintain the magnetization directions of the initialization procedure. Because the magnetization directions of the upper and lower ferromagnetic layers 23c and 23a are the same, the MTJ cell 23 may have a low resistance $R_L$. If it is defined that a low resistance $R_L$ state is logic "0", it follows that when values input to the input line 25A and the input line 25B are logic "0", the state of the MTJ cell 23 is logic "0".

Figure 6C:
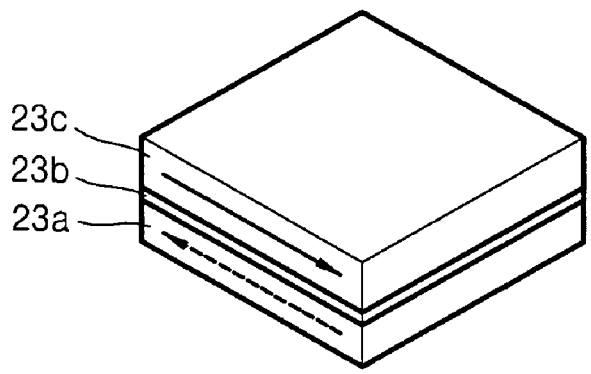
Figure 6D:
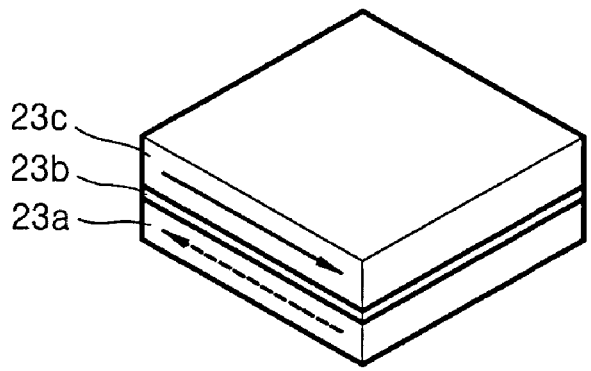
Figure 6E:
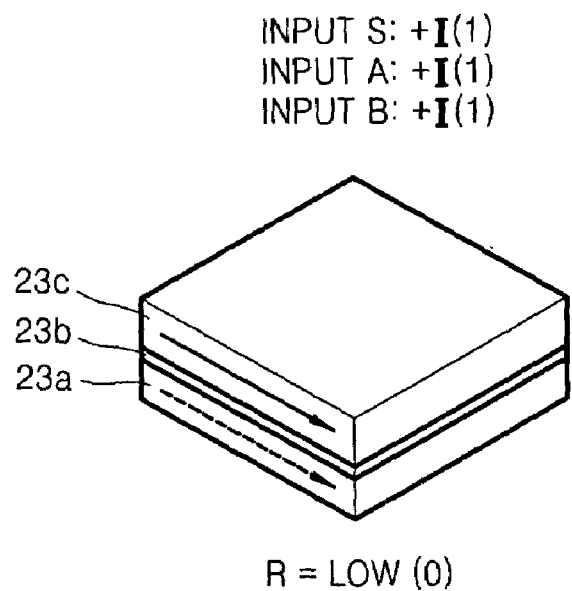

As illustrated in FIG. 6C, if a positive current +I is applied to both the input line 25S and the input line 25B and a negative current −I is applied to the input line 25A, the magnetization direction of the upper ferromagnetic layer 23c may be changed to the right direction, and thus the MTJ cell 23 may have a high resistance $R_H$. Thus, when the values input to the input line 25A and the input line 25B are logic "0" and "1", respectively, the state of the MTJ cell 23 may be logic "1". As illustrated in FIG. 6D, if a positive current +I is applied to both the input line 25S and the input line 25A and a negative current −I is applied to the input line 25B, the magnetization direction of the upper ferromagnetic layer 23c may be changed to the right direction, and thus the MTJ cell 23 may have a high resistance $R_H$. Thus, when the values input to the input line 25A and the input line 25B are logic "1" and "0", respectively, the state of the MTJ cell 23 may be logic "1". Finally, as illustrated in FIG. 6E, if a positive current +I is applied to all three of the input lines 25A, 25B, and 25S, the magnetization directions of the upper and lower ferromagnetic layers 23c and 23a may be changed to the right direction, and thus the MTJ cell 23 may have a low resistance $R_L$. Thus, when the values input to the input line 25A and the input line 25B are both logic "1", the state of the MTJ cell 23 may be logic "0".

Figure 7:
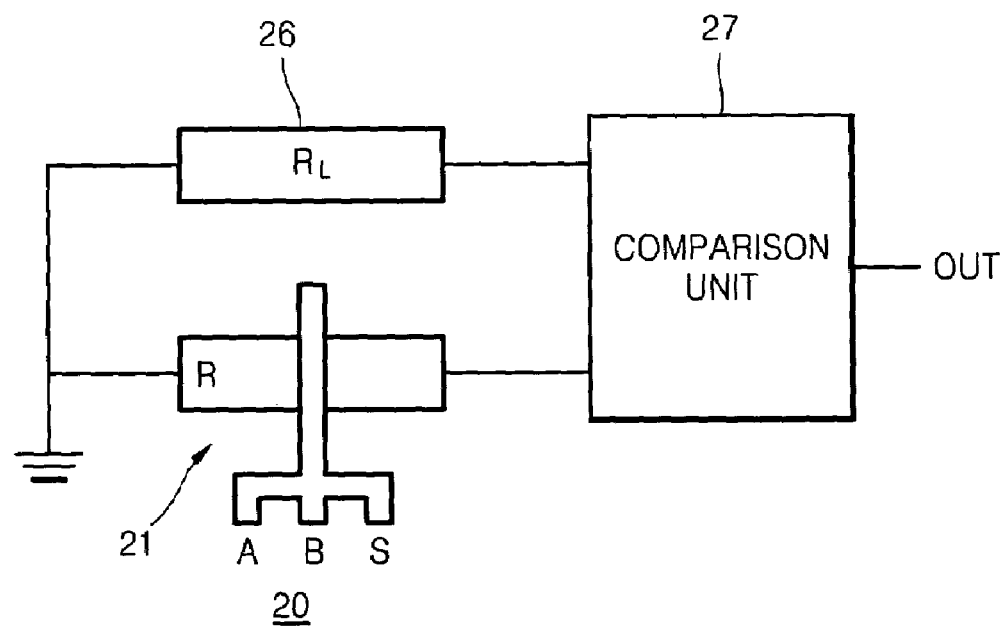
FIG. 7 is a circuit diagram of an XOR logic circuit using the MTJ cell driver of FIG. 5, according to an example embodiment.

An output of a final logic value may be realized by comparing the resistance of the MTJ cell 23 to the resistance of a reference resistor. FIG. 7 is a circuit diagram of an XOR logic circuit 20 including the MTJ cell driver 21 of FIG. 5, a reference resistor 26, and a comparison unit 27, according to an example embodiment. In FIG. 7, the reference resistor 26 may have, for example, the low resistance $R_L$. In example embodiments, the comparison unit 27 outputs logic "0" if the resistance of the MTJ cell 23 is the same as the resistance of the reference resistor 26. Similarly, the comparison unit 27 outputs logic "1" if the resistance of the MTJ cell 23 is higher than the resistance of the reference resistor 26. In another example embodiment, the resistance of the reference resistor 26 can be in a range between the high resistance $R_H$ and the low resistance $R_L$ of the MTJ cell 23. In example embodiments, the comparison unit 27 outputs logic "0" if the resistance of the MTJ cell 23 is lower than the resistance of the reference resistor 26 and outputs logic "1" if the resistance of the MTJ cell 23 is higher than the resistance of the reference resistor 26. However, these example logic value comparisons may be altered simply through different comparison units. For example, different logic gates and/or buffers may be used to compare the reference resistance to the resistance of the MTJ cell.

Like the conventional XOR logic circuit (as shown in FIG. 1), the XOR logic circuit 20 according to some example embodiments may initialize the magnetization directions of the upper and lower ferromagnetic layers 23c and 23a before and after a logic operation is performed. However, because the initialization can be performed with one procedure, the XOR logic circuit 20 according to example embodiments may operate relatively faster than the conventional XOR logic circuit (e.g., 1.5 times faster).

Figure 8A:
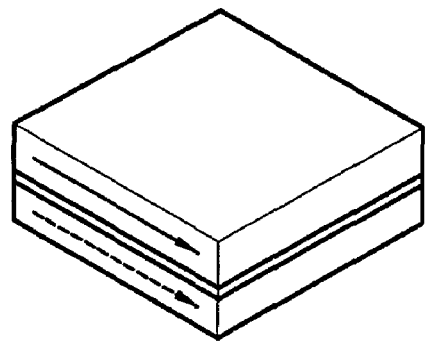
FIGS. 8A through 8E illustrate operational states of the MTJ cell of FIG. 5, according to an example embodiment.
Figure 8B:
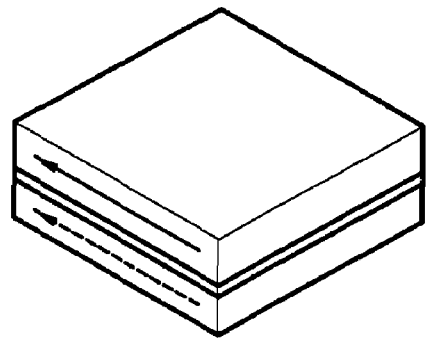
Figure 8C:
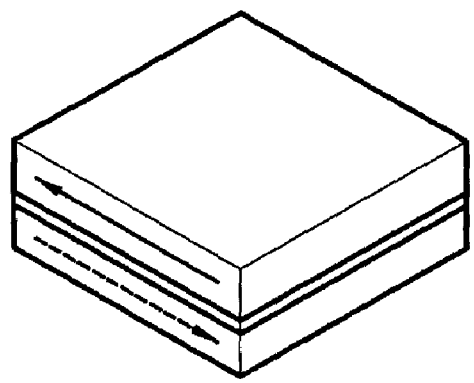
Figure 8D:
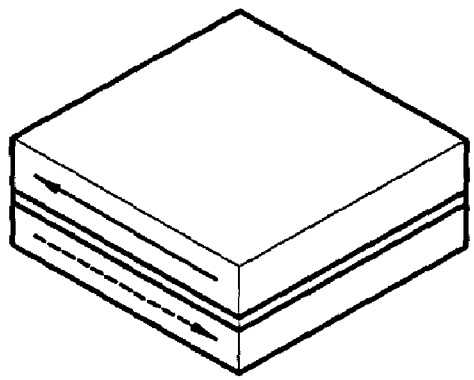
Figure 8E:
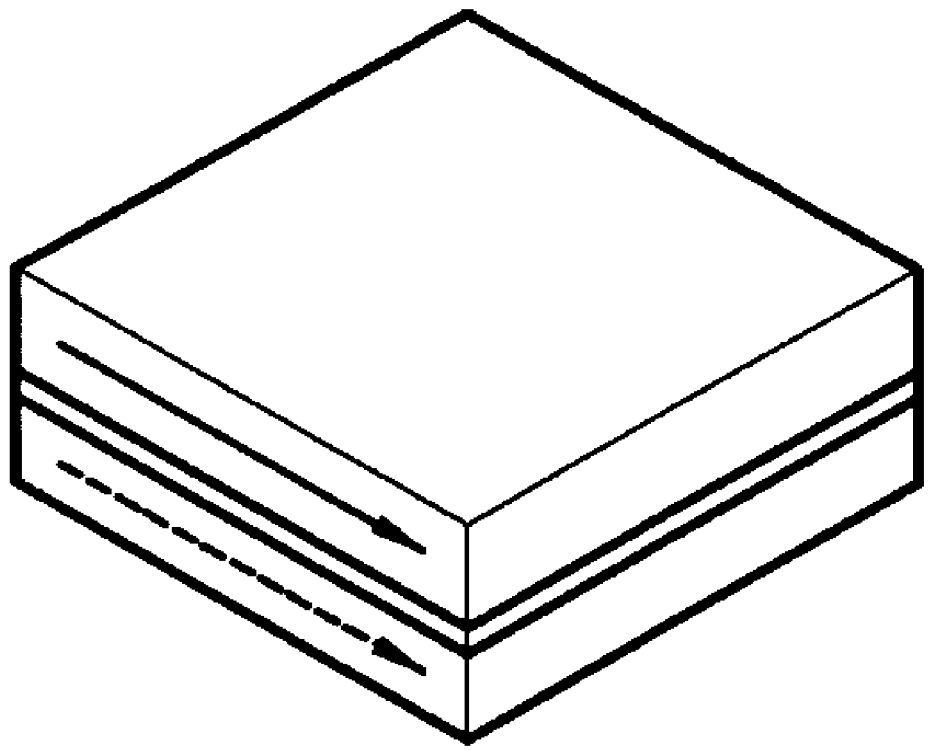

FIGS. 8A through 8E illustrate operational states of the MTJ cell 23 of FIG. 5, according to another example embodiment. Initialization of the MTJ cell 23 may be illustrated in FIG. 8A. However, the directions of currents applied in the initialization of the MTJ cell 23 in FIG. 8A are opposite to those of FIG. 6A. That is, the upper and lower ferromagnetic layers 23c and 23a may be magnetized in the right direction by applying a positive current +I to all three of the input lines 25A, 25B, and 25S. After the initialization, as illustrated in FIGS. 8B through 8E, the direction of the current of the input line 25S in logic operations is maintained and/or applied as −I. This is opposite to the previously described example embodiments. However, the directions of the currents applied to the input line 25A and the input line 25B may be determined by logic values input as in FIGS. 6B through 6E. That is, if the same current, −I or +I, is applied to both the input lines 25A and 25B, the MTJ cell 23 may have the low resistance $R_L$. If a negative current −I is applied to any one of the input lines 25A and 25B and a positive current +I is applied to the other one of the input lines 25A and 25B, the MTJ cell 23 may have the high resistance $R_H$. As such, the operational states illustrated is FIG. 8A through 8E may be similar to those described previously. Therefore, detailed descriptions will be omitted herein for the sake of brevity.

Figure 9:
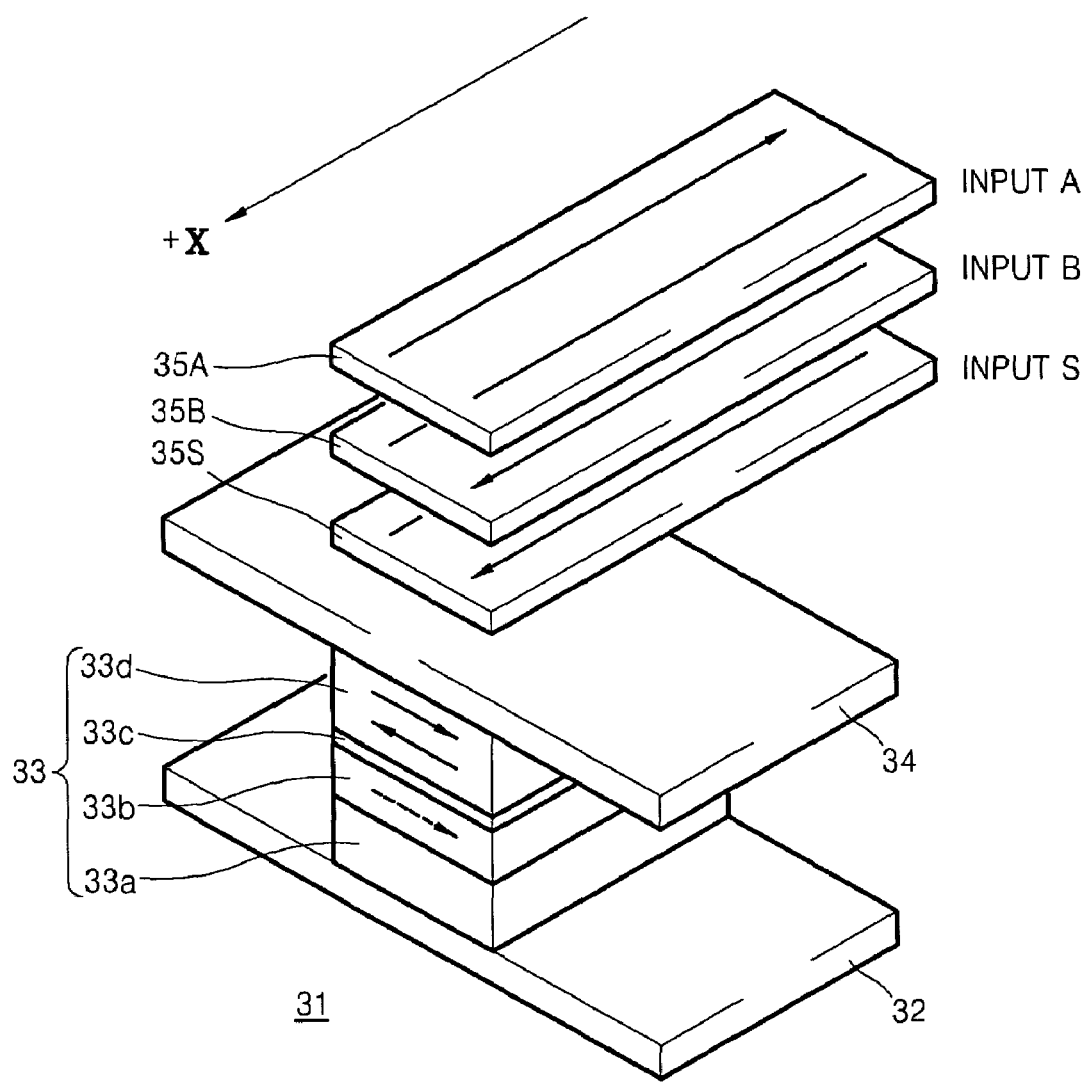
FIG. 9 is a schematic perspective view of an MTJ cell driver for realizing an XOR logic circuit, according to an example embodiment.

FIG. 9 is a schematic perspective view of an MTJ cell driver 31 for realizing an XOR logic circuit, according to another example embodiment. Referring to FIG. 9, the MTJ cell driver 31 may include an MTJ cell 33, an upper electrode 34, and a lower electrode 32, which may be disposed on the top and bottom of the MTJ cell 33, respectively. The MTJ cell driver may also include three parallel input lines 35A, 35B, and 35S, which may cross above the upper electrode 34. The MTJ cell 33 may further include an anti-ferromagnetic layer 33a, a fixed ferromagnetic layer 33b disposed on the anti-ferromagnetic layer 33a, a tunnel barrier layer 33c disposed on the fixed ferromagnetic layer 33b, and a free ferromagnetic layer 33d disposed on the tunnel barrier layer 33c. As illustrated in FIG. 9, the three parallel input lines 35A, 35B, and 35S may be arranged vertically (e.g., 25A on 25B on 25S) and/or in a stacked arrangement.

In the MTJ cell 33, according to example embodiments, because the anti-ferromagnetic layer 33a may perform ferromagnetic exchange coupling with the fixed ferromagnetic layer 33b, and is disposed below the fixed ferromagnetic layer 33b, a magnetization direction of the fixed ferromagnetic layer 33b may not be changed, regardless of the directions of currents applied to the three input lines 35A, 35B, and 35S. For example, the magnetization direction of the fixed ferromagnetic layer 33b may be fixed to the right. If the directions of the currents applied to two of the three input lines 35A, 35B, and 35S are the same, the magnetization direction of the free ferromagnetic layer 33d may be changed according to the directions of the currents. For example, in FIG. 9, when a positive current +I, which may flow in the +X direction, is applied to at least two of the three input lines 35A, 35B, and 35S, the free ferromagnetic layer 33d may be magnetized in the right direction. If a negative current −I, which flows in the −X direction, is applied to at least two of the three input lines 35A, 35B, and 35S, the free ferromagnetic layer 33d may be magnetized in the left direction.

Figure 10A:
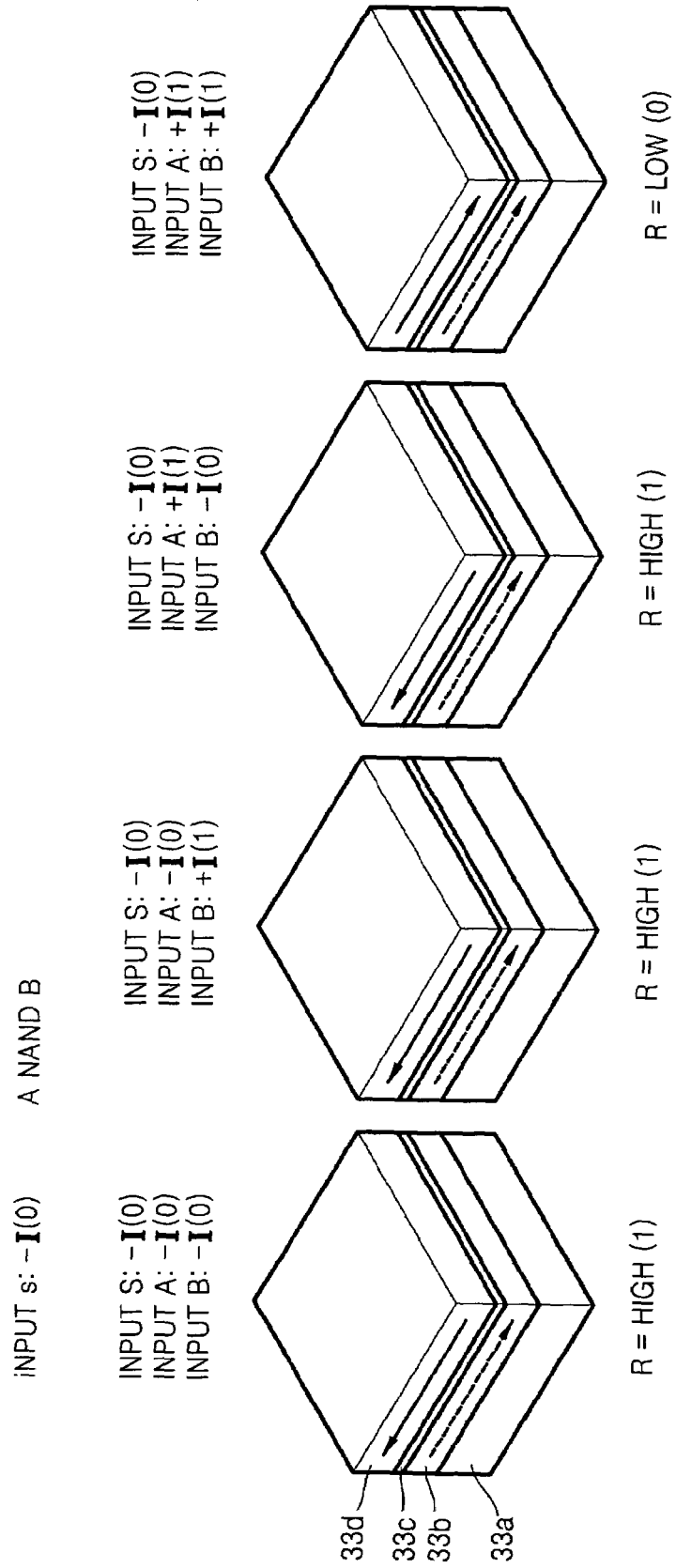
FIGS. 10A and 10B illustrate operational states of the MTJ cell of FIG. 9, according to an example embodiment.
Figure 10B:
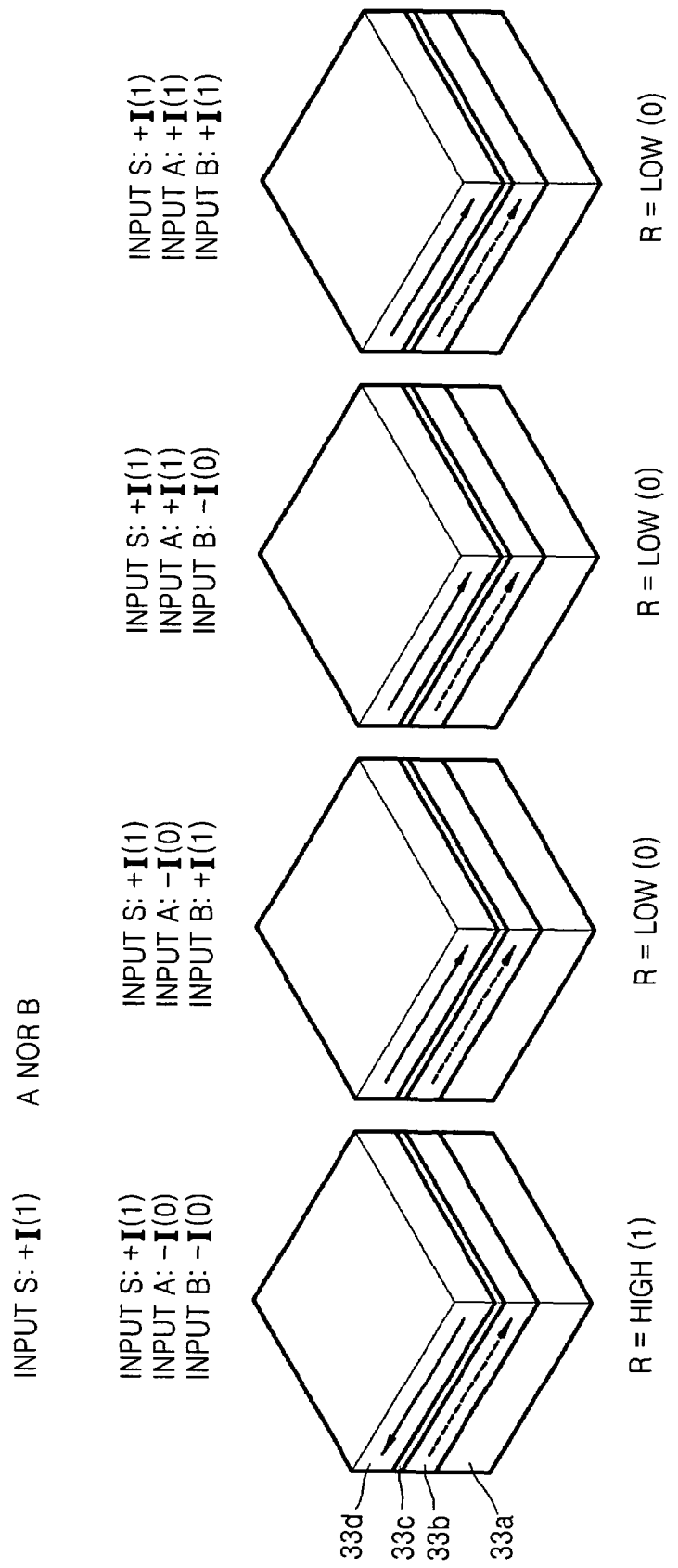
Figure 11:
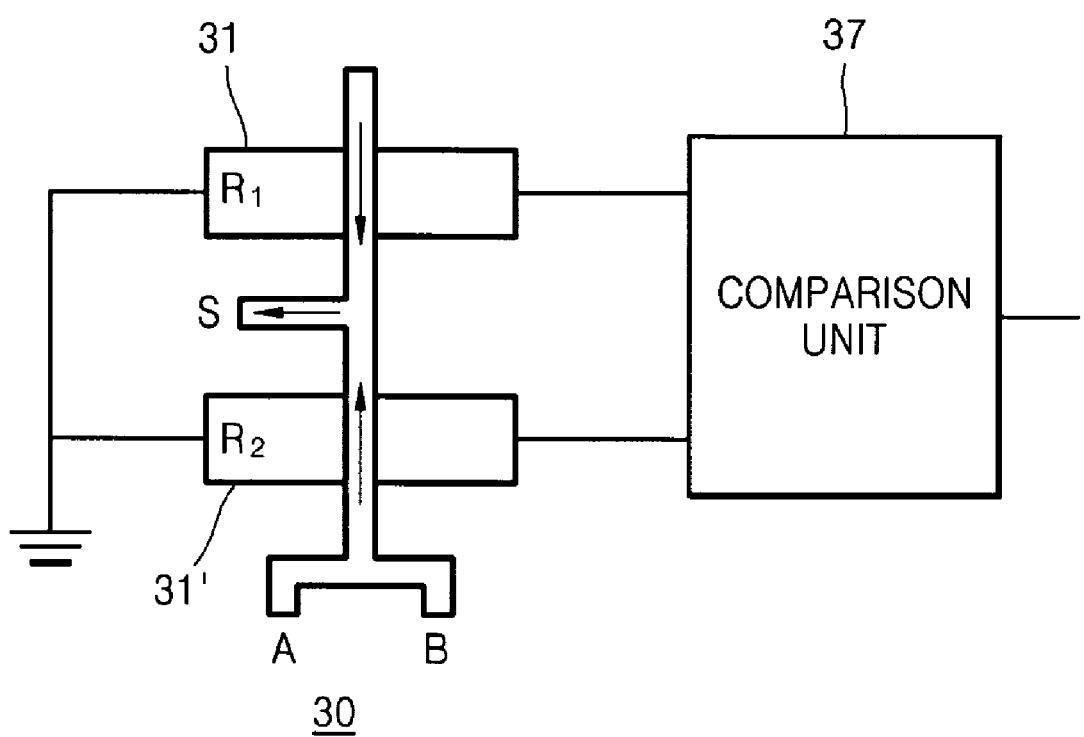
FIG. 11 is a circuit diagram of an XOR logic circuit using the MTJ cell driver of FIG. 9, according to an example embodiment.

FIG. 11 is a circuit diagram of an XOR logic circuit 30 according to another example embodiment. Referring to FIG. 11, the XOR logic circuit unit 30 may include separately operated first and second MTJ cell drivers 31 and 31', and a comparison unit 37. The first and second MTJ cell drivers 31 and 31' may each be identical to the MTJ cell driver 31 shown in FIG. 9. FIG. 10A and 10B illustrate operational states of the MTJ cells 31 and 31'. The comparison unit 37 compares the resistances of the first and second MTJ cell drivers 31 and 31' and outputs logic "0" or "1" according to the comparison result. To perform logic operations without an initialization process, the directions of currents applied to an input line 35A and an input line 35B of the first MTJ cell driver 31 are the same as the directions of currents applied to an input line 35A and an input line 35B of the second MTJ cell driver 31'. However, the direction of a current applied to an input line 35S of the first MTJ cell driver 31 is opposite to the direction of a current applied to an input line 35S of the second MTJ cell driver 31'.

For example, a negative current −I, is applied to the input line 35S of the first MTJ cell driver 31, and a positive current +I, is applied to the input line 35S of the second MTJ cell driver 31'. In this example, logic operations of the first MTJ cell driver 31 are illustrated in FIG. 10A, and logic operations of the second MTJ cell driver 31' are illustrated in FIG. 10B. In FIG. 10A and FIG. 10B, INPUT A denotes a current applied to the input line 35A, INPUT B denotes a current applied to the input line 35B, and INPUT S denotes a current applied to the input line 35S. Here, a positive current +I, which flows in the +X direction, is defined as logic "1" for that input line and a negative current −I, which flows in the −X direction, is defined as logic "0" for that input line. In addition, a state where the MTJ cell 33 has the low resistance $R_L$ may be defined as logic "0", and a state where the MTJ cell 33 has the high resistance $R_H$ may be defined as logic "1".

As illustrated in FIG. 10A, if the negative current −I is applied to the input line 35S, the MTJ cell 33 has the low resistance $R_L$ when a positive current +I is applied to both the input line 35A and the input line 35B. The MTJ cell 33 has the high resistance $R_H$ in other cases. Thus, the MTJ cell 33 may operate as a NAND logic circuit. As illustrated in FIG. 10B, if a positive current +I is applied to the input line 35S, the MTJ cell 33 has the high resistance $R_H$ when a negative current −I is applied to both the input line 35A and the input line 35B. The MTJ cell 33 has the low resistance $R_L$ in other cases. Thus, the MTJ cell 33 may operate as a NOR logic circuit.

The comparison unit 37 outputs logic "0" if the resistance of the MTJ cell 33 of the first MTJ cell driver 31 is the same as the resistance of the MTJ cell 33 of the second MTJ cell driver 31' and outputs logic "1" if the resistance of the MTJ cell 33 of the first MTJ cell driver 31 is higher than the resistance of the MTJ cell 33 of the second MTJ cell driver 31'. Therefore, the output of the comparison unit 37 may be the same as the output of an XOR logic circuit.

Figure 12A:
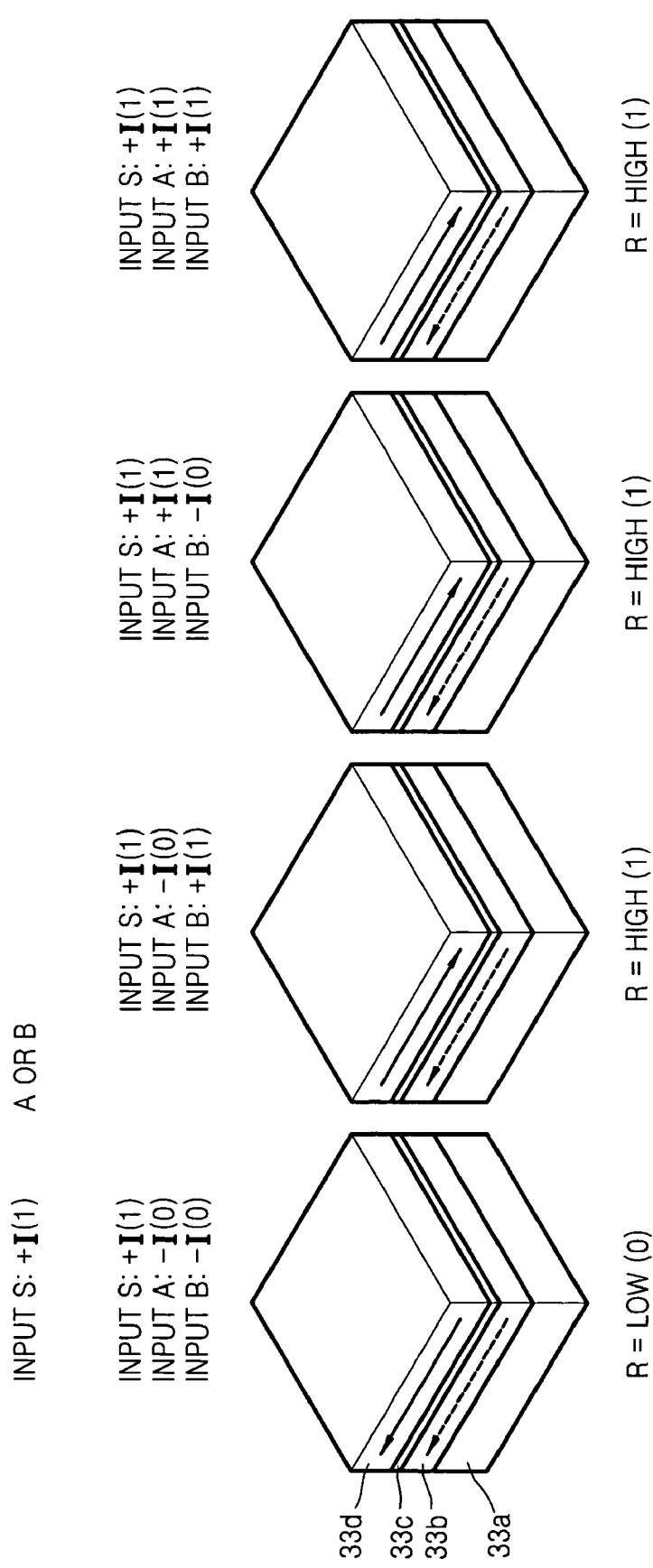
FIGS. 12A and 12B illustrate operational states of the MTJ cell of FIG. 9, according to an example embodiment.
Figure 12B:
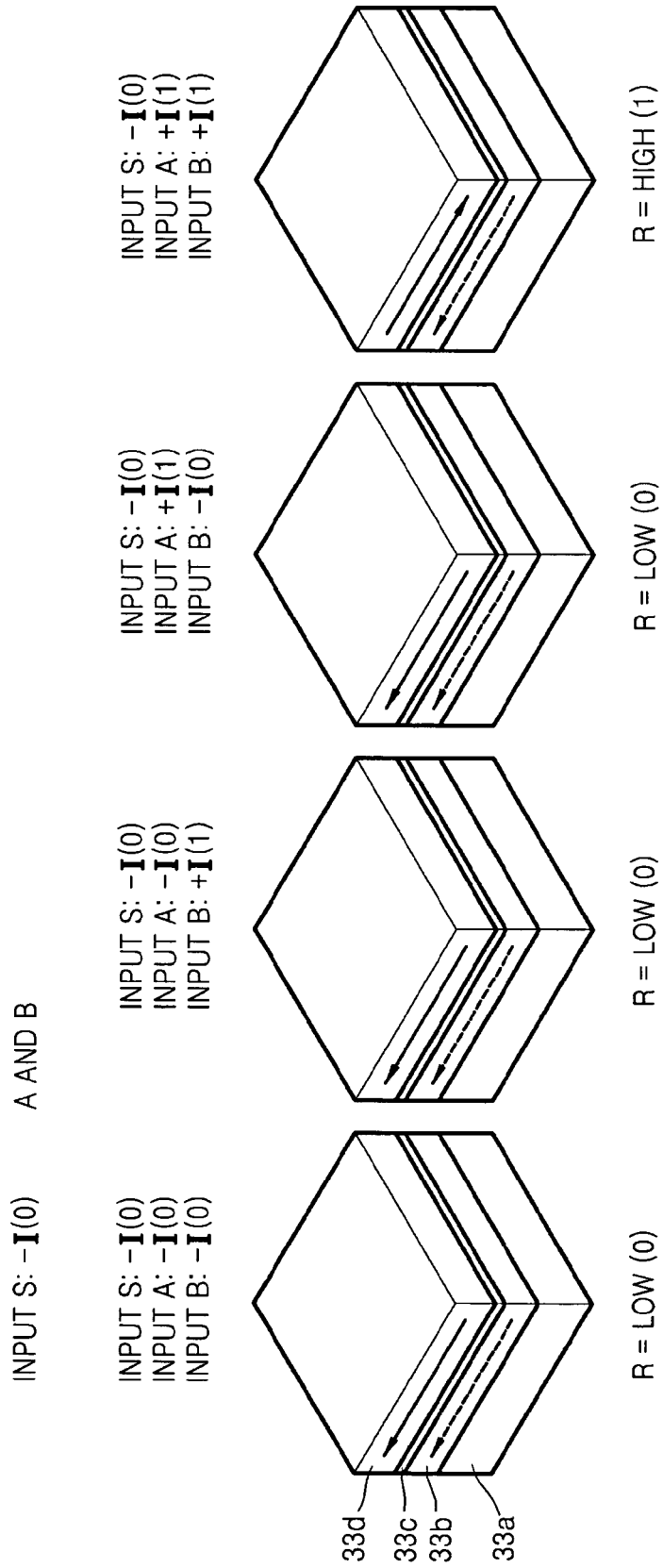
Figure 13:
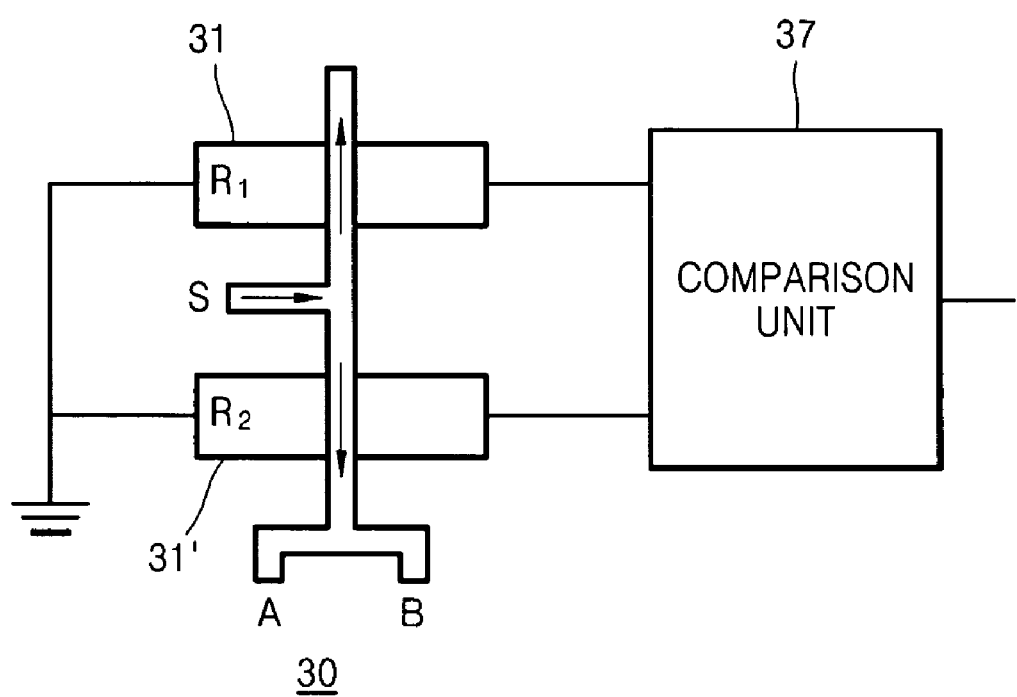
FIG. 13 is a circuit diagram of an XOR logic circuit using the MTJ cell driver of FIG. 9, according to an example embodiment.

FIGS. 12A and 12B and FIG. 13 illustrate the respective operations of the MTJ cell drivers 31 and 31' and the XOR logic circuit 30 in a case where the magnetization direction of the fixed ferromagnetic layer 33b of the MTJ cell 33 is fixed to the left direction regardless of the directions of the currents applied to the three input lines 35A, 35B, and 35S. In FIG. 12A and FIG. 12B, INPUT A denotes a current applied to the input line 35A, INPUT B denotes a current applied to the input line 35B, and INPUT S denotes a current applied to the input line 35S. In this case, opposite to that illustrated in FIGS. 10A, 10B, and 11, a positive current +I is applied to the input line 35S of the first MTJ cell driver 31, and a negative current −I is applied to the input line 35S of the second MTJ cell driver 31'.

Then, as illustrated in FIG. 12A, if a positive current +I is applied to the input line 35S, the MTJ cell 33 has the low resistance $R_L$ when a negative current −I is applied to both the input line 35A and the input line 35B. The MTJ cell 33 has the high resistance $R_H$ in other cases. Thus, the MTJ cell 33 may operate as an OR logic circuit. As illustrated in FIG. 12B, if a negative current −I is applied to the input line 35S, the MTJ cell 33 has the high resistance $R_H$ when a positive current +I is applied to both the input line 35A and the input line 35B.

The MTJ cell 33 has the low resistance $R_L$ in other cases. Thus, the MTJ cell 33 may operate as an AND logic circuit.

As in the example embodiment of FIG. 11, the comparison unit 37 of FIG. 13 may output logic "0" if the resistance of the MTJ cell 33 of the first MTJ cell driver 31 is the same as the resistance of the MTJ cell 33 of the second MTJ cell driver 31' and may output logic "1" if the resistance of the MTJ cell 33 of the first MTJ cell driver 31 is higher than the resistance of the MTJ cell 33 of the second MTJ cell driver 31'. Thus, the output of the comparison unit 37 may be the same as the output of an XOR logic circuit.

The XOR logic circuit 30 according to example embodiments may perform logic operations without initialization. Thus, the XOR logic circuit 30 according to example embodiments may operate relatively faster than the conventional XOR logic circuit (e.g., 3 times faster).

Example embodiments may be used to manufacture XOR logic circuits, NOR logic circuits, and NAND logic circuits, which may be used to construct non-memory and memory components performing functions. As such, it will be understood that all such modifications are intended to be included within the example embodiments disclosed herein.

As described above, an XOR logic circuit according to example embodiments of the present invention may operate with an initialization process of one procedure or with no procedure at all. Thus, an operating speed may be improved compared to a conventional XOR logic circuit. Moreover, since a current may not have to be directly applied to an MTJ cell, a ferromagnetic layer in the MTJ cell may not be degraded. Thus, the life span of the MTJ cell may be lengthened compared to the conventional XOR logic circuit.

While example embodiments have been shown and described with reference to particular embodiments thereof, it will be understood by those skilled in the art that various changes in form and details may be made therein without departing from the spirit and scope of these embodiments as defined by the claims. The example embodiments should be considered in a descriptive sense only and not for purposes of limitation. Therefore, such scope is defined not by the detailed description but by the claims, and all differences within the scope will be construed as being included in the example embodiments.

What is claimed is:

1. A magnetic tunneling junction (MTJ) cell driver comprising:
    a lower electrode;
    an MTJ cell on the lower electrode;
    an upper electrode on the MTJ cell; and
    first through third input lines arranged in parallel on the upper electrode.

2. The MTJ cell driver of claim 1, wherein the MTJ cell includes:
    a lower ferromagnetic layer;
    a tunnel barrier layer on the lower ferromagnetic layer; and
    an upper ferromagnetic layer on the tunnel barrier layer.

3. The MTJ cell driver of claim 2, wherein:
    if the directions of currents applied to the first through third input lines are all the same, magnetization directions of the upper and lower ferromagnetic layers are changed according to the direction of the currents; and
    if the directions of two currents applied to the first, second, and third input lines are the same, only the magnetization direction of the upper ferromagnetic layer is changed according to the direction of the at least two currents.

4. The MTJ cell driver of claim 3, wherein the MTJ cell is initialized by applying a current having the same direction to all of the first, second, and third input lines.

5. An Exclusive-OR (XOR) logic circuit comprising:
    the MTJ cell driver of claim 1;
    a reference resistor; and
    a comparison unit outputting logic "0" or "1" by comparing a resistance of the MTJ cell to the resistance of the reference resistor,
    wherein the MTJ cell driver switches the resistance of the MTJ cell between a first resistance and a second resistance.

6. The XOR logic circuit of claim 5, wherein during a logic operation, the direction of a current applied to the first input line is maintained opposite to the direction of an initialization current, and the directions of currents applied to the second and third input lines are determined by input logic values.

7. The XOR logic circuit of claim 5, wherein the resistance of the reference resistor is the same as the first resistance of the MTJ cell.

8. The XOR logic circuit of claim 6, wherein the comparison unit outputs logic "0" if the resistance of the MTJ cell is the same as the resistance of the reference resistor and outputs logic "1" if the resistance of the MTJ cell is higher than the resistance of the reference resistor.

9. The XOR logic circuit of claim 5, wherein the resistance of the reference resistor is in a range between the first and second resistances of the MTJ cell.

10. The XOR logic circuit of claim 9, wherein the comparison unit outputs logic "0" if the resistance of the MTJ cell is lower than the resistance of the reference resistor and outputs logic "1" if the resistance of the MTJ cell is higher than the resistance of the reference resistor.

11. The MTJ cell driver of claim 1, wherein:
    the first input line is on the upper electrode;
    the second input line is on the first input line; and
    the third input line is on the second input line.

12. The MTJ cell driver of claim 1, wherein the MTJ cell includes:
    an anti-ferromagnetic layer;
    a fixed ferromagnetic layer on the anti-ferromagnetic layer, having a fixed magnetization direction;
    a tunnel barrier layer on the fixed ferromagnetic layer; and
    a free ferromagnetic layer on the tunnel barrier layer.

13. The MTJ cell driver of claim 12, wherein if the directions of at least two currents applied to the first, second, and third input lines are the same, the magnetization direction of the free ferromagnetic layer is changed according to the direction of the at least two currents.

14. An Exclusive-OR (XOR) logic circuit comprising:
    a first and a second MTJ cell driver according to claim 12;
    a comparison unit outputting logic "0" or "1" by comparing a resistance of the first MTJ cell to a resistance of the second MTJ cell, wherein the first and second MTJ cell drivers switch the resistance of the first MTJ cell and the second MTJ cell, between a first resistance and a second resistance.

15. The XOR logic circuit of claim 14, wherein during a logic operation,
    the direction of a current applied to the first input line of the first MTJ cell driver is opposite to the direction of a current applied to the first input line of the second MTJ cell driver, and
    the directions of currents applied to the second and third input lines of the first and second MTJ cell drivers are determined by input logic values.

16. The XOR logic circuit of claim 14, wherein:
  logic "1" is defined as a state where the resistance of each of the first and second MTJ cells is relatively high;
  logic "0" is defined as a state where the resistance of each of the first and second MTJ cells is relatively low;
  the first MTJ cell driver operates as a NAND logic circuit; and
  the second MTJ cell driver operates as a NOR logic circuit.

17. The XOR logic circuit of claim 14, wherein the comparison unit outputs logic "0" if the resistance of the first MTJ cell is the same as the resistance of the second MTJ cell and outputs logic "1" if the resistance of the first MTJ cell is higher than the resistance of the second MTJ cell.

18. A method of operating an Exclusive-OR (XOR) logic circuit, the method comprising:
  maintaining a direction of a current applied to a first input line of a first MTJ cell driver including a MTJ cell;
  applying currents to second and third input lines of the MTJ cell driver arranged in parallel and cross above the MTJ cell determined by input logic values; and
  outputting logic "0" or "1" by comparing the resistance of the MTJ cell to a reference resistance.

19. The method of claim 18, further comprising:
  initializing the MTJ cell in order to magnetize upper and lower ferromagnetic layers in the same direction by applying currents to the first through third input lines.

20. The method of claim 19, wherein the current maintained on the first input line is opposite to the direction of the current applied during the initialization.

21. The method of claim 19, wherein:
  if the directions of currents applied to the first through third input lines are all the same, magnetization directions of the upper and lower ferromagnetic layers are changed according to the directions of the currents; and
  if the directions of two currents applied to the first through third input lines are the same, only the magnetization direction of the upper ferromagnetic layer is changed according to the directions of the currents.

22. The method of claim 18, wherein:
  logic "0" is output if the resistance of the MTJ cell is the same as the reference resistance; and
  logic "1" is output if the resistance of the MTJ cell is higher than the reference resistance.

23. The method of claim 18, wherein the reference resistance is a MTJ cell of a second MTJ driver.

24. The method of claim 23, wherein:
  the direction of a current applied to the first input line of the first MTJ cell driver is opposite to the direction of a current applied to the first input line of the second MTJ cell driver; and
  the directions of currents applied to the second and third input lines of the first and second MTJ cell drivers are determined by input logic values.

25. The method of claim 23, wherein:
  logic "1" is defined as a state where the resistance of each of the MTJ cells is relatively high;
  logic "0" is defined as a state where the resistance of each of the MTJ cells is relatively low;
  the first MTJ cell driver operates as a NAND logic circuit; and
  the second MTJ cell driver operates as a NOR logic circuit.

* * * * *